US006913072B2

(12) United States Patent
Luo

(10) Patent No.: US 6,913,072 B2
(45) Date of Patent: Jul. 5, 2005

(54) HEAT DISSIPATING DEVICE

(76) Inventor: Chin-Kuang Luo, 5F, No. 56, Min-Chuan Rd., Chung Dist., Taichung City (TW)

( * ) Notice: Subject to any disclaimer, the term of this patent is extended or adjusted under 35 U.S.C. 154(b) by 0 days.

(21) Appl. No.: 10/683,420

(22) Filed: Oct. 10, 2003

(65) Prior Publication Data

US 2004/0238160 A1 Dec. 2, 2004

(30) Foreign Application Priority Data

Jun. 2, 2003 (TW) ..................................... 92210120 U

(51) Int. Cl.[7] ............................................... F28D 15/02

(52) U.S. Cl. ............................. 165/104.21; 165/104.33

(58) Field of Search ....................... 165/104.21, 104.33, 165/104.26, 104.19; 257/715; 361/700; 174/15.2

(56) References Cited

U.S. PATENT DOCUMENTS 6,105,662 A * 8/2000 Suzuki .................. 165/104.33
6,158,502 A * 12/2000 Thomas ................. 165/104.26
6,164,368 A * 12/2000 Furukawa et al. ..... 165/104.33
6,397,941 B1 * 6/2002 McCullough .......... 165/104.33
6,625,021 B1 * 9/2003 Lofland et al. ........ 165/104.33
6,625,024 B2 * 9/2003 Mermet-Guyennet ....... 361/700
6,679,317 B2 * 1/2004 Kokubo et al. ........ 165/104.26
6,695,040 B1 * 2/2004 Kung et al. ............ 165/104.26
2001/0050164 A1 * 12/2001 Wagner et al. ......... 165/104.33
2002/0033249 A1 * 3/2002 Chuang ................ 165/104.33

* cited by examiner

*Primary Examiner*—Teresa J. Walberg
(74) *Attorney, Agent, or Firm*—Trop, Pruner & Hu, P.C.

(57) ABSTRACT

A heat dissipating device includes a tubular body and a heat transfer fluid. The tubular body has opposite top and bottom ends, a peripheral wall, a main chamber defined by the top and bottom ends and the peripheral wall, at least one hollow extension part extending outwardly from the peripheral wall, and a plurality of fins extending outwardly from the peripheral wall and the extension part. The hollow extension part has an extension chamber that is in fluid communication with the main chamber, and is elongated in a radial direction and narrow in a direction transverse to the radial direction. The heat transfer fluid is contained in the main chamber and the extension chamber.

5 Claims, 8 Drawing Sheets

HEAT DISSIPATING DEVICE

CROSS-REFERENCE TO RELATED APPLICATION

This application claims priority of Taiwanese Application No. 092210120, filed on Jun. 2, 2003.

BACKGROUND OF THE INVENTION

1. Field of the Invention

The invention relates to a heat dissipating device, more particularly to a heat dissipating device that can dissipate heat quickly.

2. Description of the Related Art

Referring to FIGS. 1 and 2, a conventional heat dissipating device 1 includes a main body 11 with an inner chamber 111, a top cover 12 and a bottom seat 13 respectively sealing top and bottom ends of the inner chamber 111, a filling tube 14 positioned at the center of the top cover 12 and in fluid communication with the inner chamber 111, and a heat transfer fluid 15 disposed in the inner chamber 111. A plurality of fins 112 extend from the outer periphery of the main body 11 and extension parts 114 that radiate from the main body 11. In use, the bottom seat 13 is seated on a heat source 2, such as a central processing unit (CPU) or an integrated circuit (IC). The heat from the heat source 2 is transmitted toward the main body 11 and the fluid 15 through the bottom seat 13.

As the fluid 15 absorbs heat, it vaporizes and carries the heat away from the heat source 4. The fins 112 serve to dissipate the heat from the fluid 5, the main body 11, and the extension parts 114.

Although the aforesaid heat dissipating device 1 can achieve its intended purpose, there is a need to provide a heat dissipating device with a more simple and reliable structure.

SUMMARY OF THE INVENTION

Therefore, the object of the present invention is to provide an improvement over a heat dissipating device of the above-described type, in which a metallic body containing a heat transfer fluid is provided with an increased heat transfer or heat exchange area.

According to this invention, a heat dissipating device comprises a tubular body and a heat transfer fluid. The tubular body is adapted to be mounted on a heat source, and has opposite top and bottom ends, a peripheral wall between the top and bottom ends, a main chamber defined by the top and bottom ends and the peripheral wall, at least one hollow extension part extending outwardly from the peripheral wall, and a plurality of fins extending outwardly from the peripheral wall and the extension part. The hollow extension part has an extension chamber that is in fluid communication with the main chamber, and is elongated in a radial direction and narrow in a direction transverse to the radial direction. The heat transfer fluid is contained in the main chamber and the extension chamber. As a result, both of the tubular body and the extension parts are in contact with the fluid, thereby providing an increased heat transfer area for the fluid.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
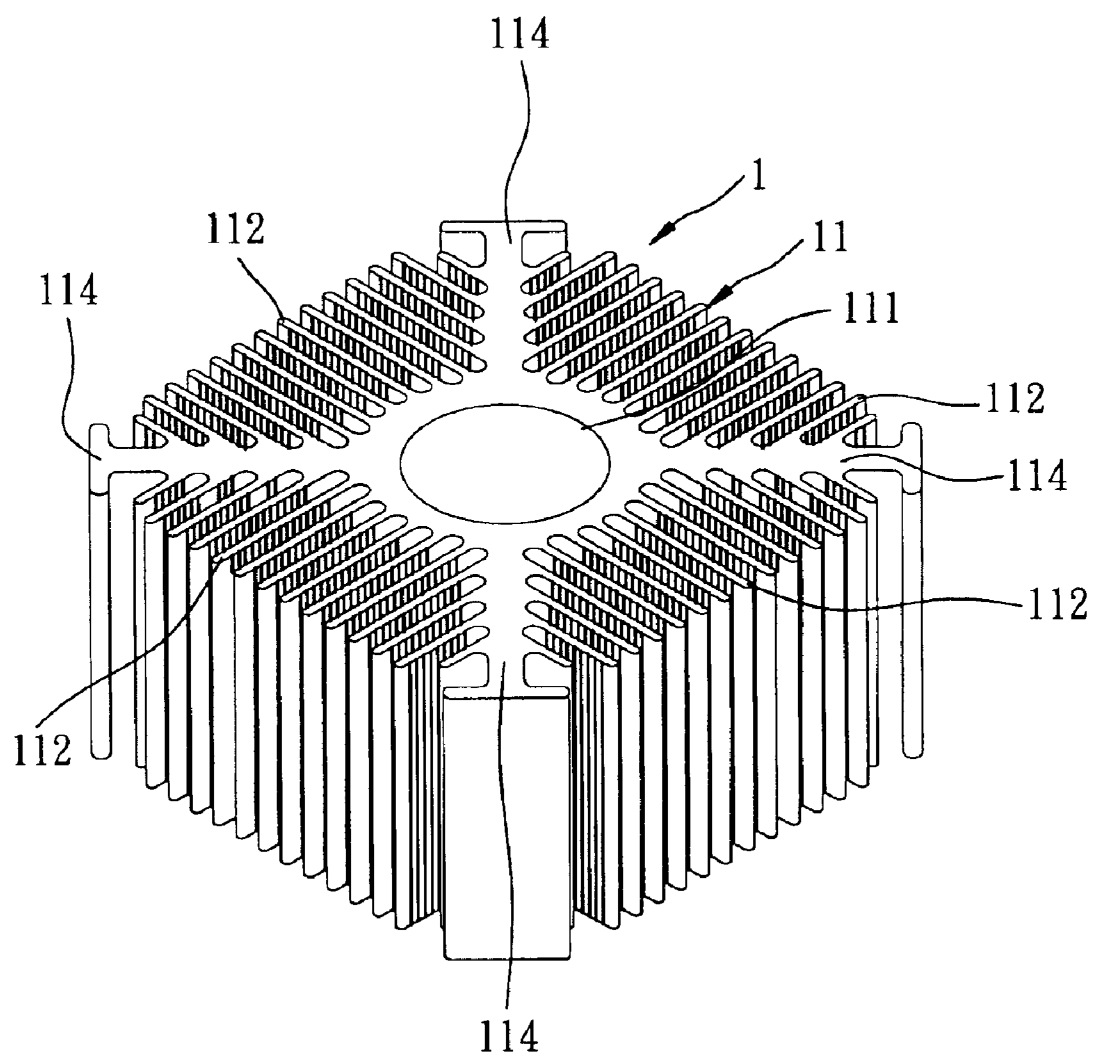
FIG. 1 is a perspective view of a main body of a conventional heat dissipating device.
Figure 2:
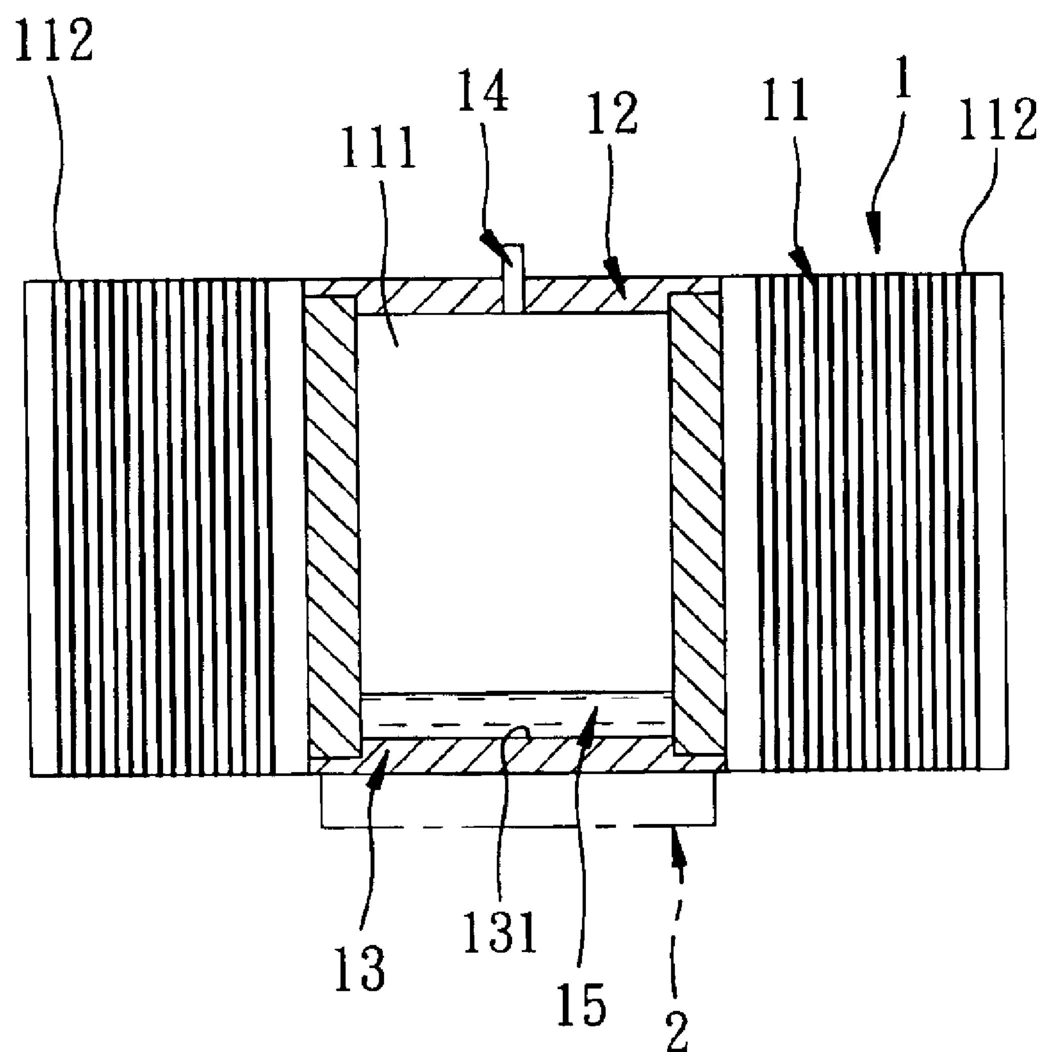
FIG. 2 is a partly sectional view of the conventional heat dissipating device.

Before the present invention is described in greater detail, it should be noted that like elements are denoted by the same reference numerals throughout the disclosure.

Figure 3:
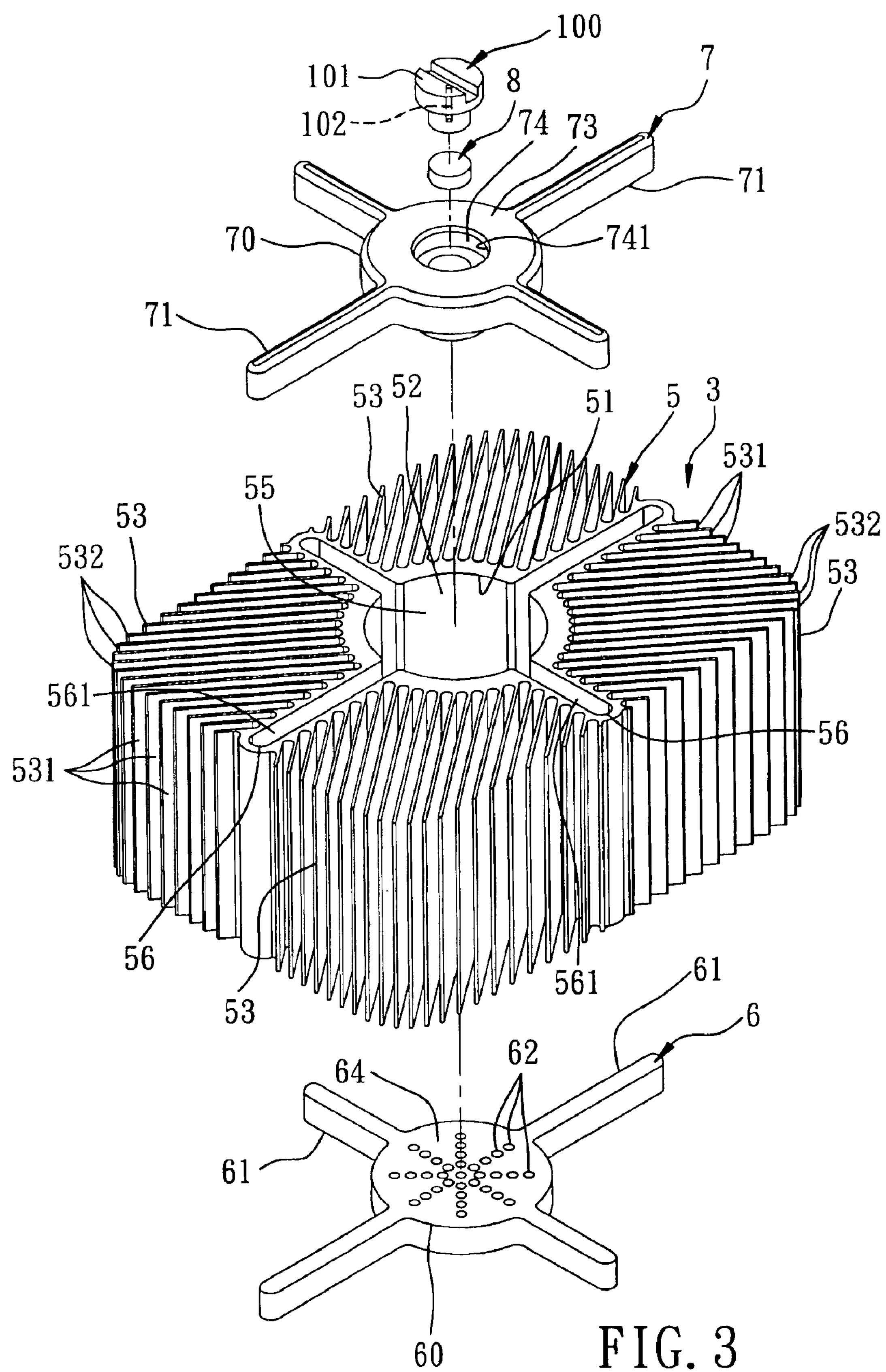
FIG. 3 is an exploded perspective view of the first preferred embodiment of a heat dissipating device according to the present invention.
Figure 4:
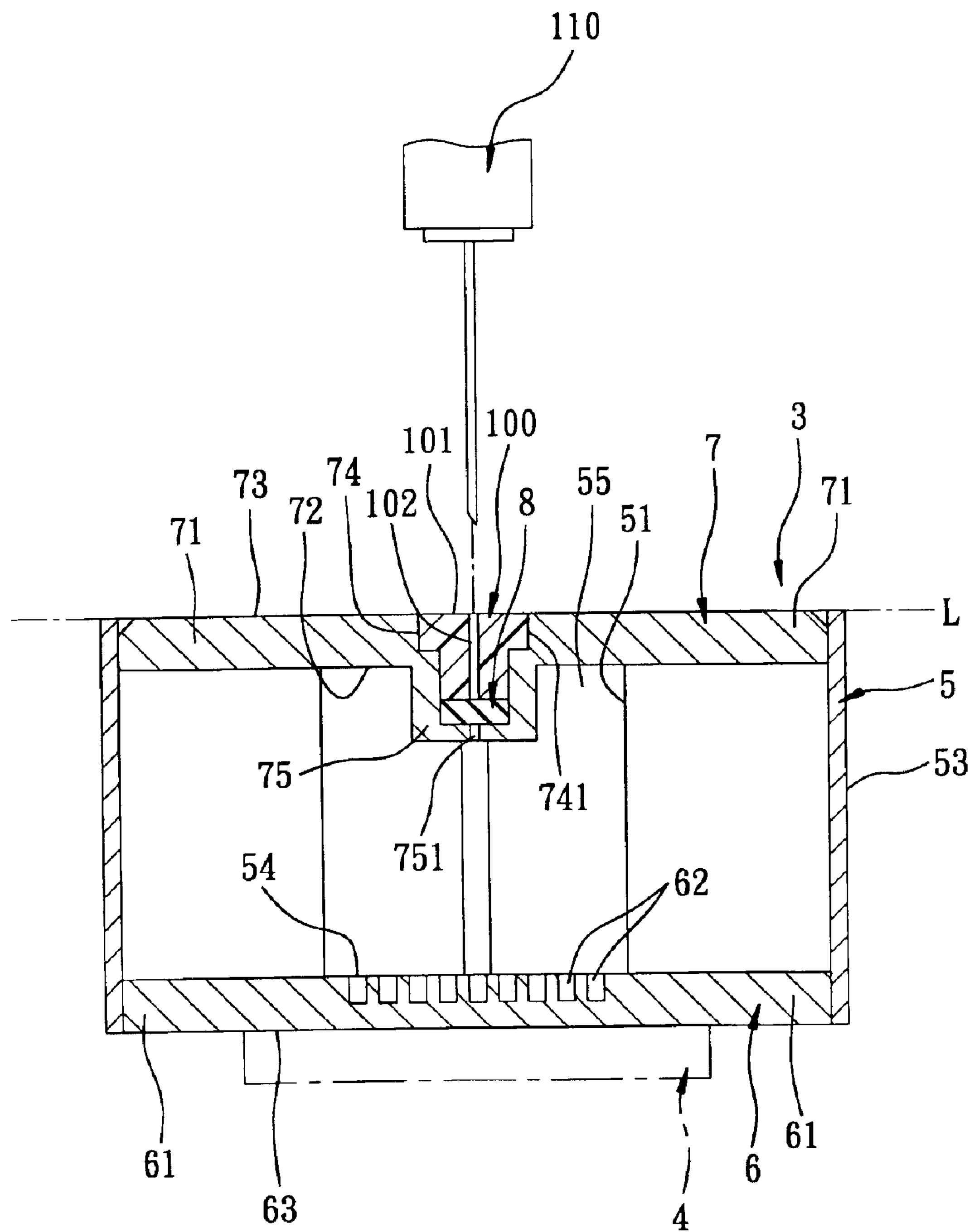
FIG. 4 is a sectional view of the first preferred embodiment in an assembled state.
Figure 5:
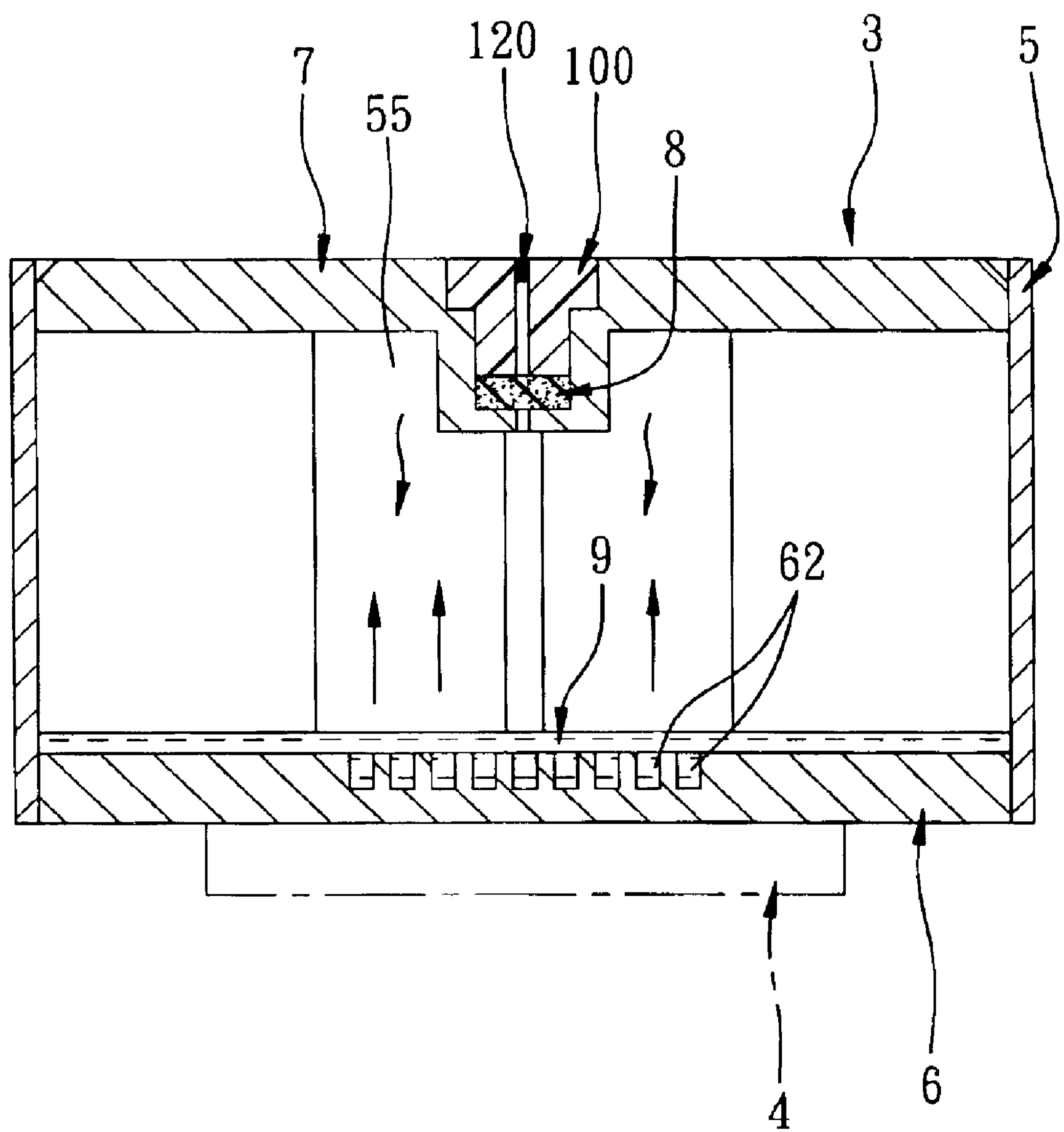
FIG. 5 is a sectional view to illustrate the tubular body of the heat dissipating device of the first preferred embodiment when sealed.

Referring to FIGS. 3 to 5, the first preferred embodiment of a heat dissipating device 3 according to the present invention is shown to comprise a metallic tubular body 5, a bottom cover member 6, a top cover member 7, an elastic sealing member 8, a heat transfer fluid 9, and a securing member 100.

The metallic tubular body 5 is adapted to be mounted on a heat source 4, and is made of a good heat conduction material, such as aluminum, copper or a metal alloy. The tubular body 5 has opposite top and bottom ends 52, 54, a peripheral wall 51 between the top and bottom ends 52, 54, a main chamber 55 defined by the top and bottom ends 52, 54 and the peripheral wall 51, a plurality of hollow extension parts 56 extending radially and outwardly from the peripheral wall 51, and a plurality of fins 53 extending outwardly from the peripheral wall 51 and the extension parts 56. In this embodiment, the number of the hollow extension parts 56 is four. Each of the hollow extension parts 56 has an extension chamber 561 that is in fluid communication with the main chamber 55, and is elongated in a radial direction and narrowed in a direction transverse to the radial direction. The fins 53 in this embodiment include a plurality of first fins 531 extending obliquely and outwardly from each of the extension parts 56, and a plurality of second fins 532 extending outwardly from the peripheral wall 51 and in parallel to the first fins 531.

The bottom cover member 6 covers the bottom end 54 of the tubular body 5, and is made of a good heat conduction material, such as aluminum, copper, or a metal alloy. The bottom cover member 6 has a cap portion 60 covering the main chamber 55, and four wing portions 61 extending radially and outwardly from the cap portion 60 and closing respectively bottom portions of the extension chambers 561 in the extension parts 56 of the tubular body 5. The cap portion 60 of the bottom cover member 6 has a bottom face 63 adapted to contact the heat source 4, and a top face 64 opposite to the bottom face 63 and formed with a plurality of spaced-apart downward slots 62 in fluid communication with the main chamber 55.

The top cover member 7 is mounted fixedly on and covers the top end 52 of the tubular body 5, and has a cap portion 70 covering the main chamber 55, and four wing portions 71 extending radially and outwardly from the cap portion 70 and closing respectively top portions of the extension chambers 561 in the extension parts 56 of the tubular body 5. The cap portion 70 of the top cover member 7 has a filling hole 74 in fluid communication with the main chamber 55.

The bottom cover member 6 and the top cover member 7 are fitted sealingly and respectively to the bottom and top ends 54, 52 of the tubular body 5.

The elastic sealing member 8 is fitted within the filling hole 74 in the cap portion 70 of the top cover member 7, and is made of an elastic material, such as a rubber or a silicone elastomer. The sealing member 8 is pierceable by a needle 110 to provide a passage for injection of the heat transfer fluid 9 through the sealing member 8, and is contractible to seal the passage.

The heat transfer fluid 9 is contained in the main chamber 55 and the extension chambers 561, and can be accumulated partially in the downward slots 62 in the bottom cover member 6. The fluid 9 can be water, ammonia, or any other liquid that vaporizes when heated and that restores to liquid form when cooled.

The securing member 100 has a shape in conformity with that of a blind hole 741 in the cap portion 70 of the top cover member 7, and is fitted sealingly in the blind hole 741 and outwardly of the sealing member 8. The securing member 100 further has a second needle hole 102 in alignment with a first needle hole 751 in the top cover member 7, and an insert piece 120 (see FIG. 5) disposed sealingly in the second needle hole 102.

Referring to FIG. 5, to fill the tubular body 5 with the heat transfer fluid 9, the needle 110 is extended into the main chamber 55 in the tubular body 5 by passing through the second needle hole 102 in the securing member 100, the sealing member 8, and the first needle hole 751 in a seat part 75 of the top cover member 7. The needle 110 is connected to a controlling unit (not shown), which operates to evacuate air from within the main chamber 55 and to introduce a predetermined amount of the heat transfer fluid 9 into the main chamber 55. When the needle 110 is withdrawn from the tubular body 5, the sealing member 8, because of its elasticity, contracts to seal the passage in the sealing member 8. Afterwards, the insert piece 120 is disposed sealingly in the second needle hole 102 in the securing member 100.

When the heat source 4, such as a central processing unit, generates heat, the heat transfer fluid 9 in the bottom cover member 6 vaporizes quickly, as shown by the upward arrows in FIG. 5. The vaporized fluid exchanges heat with the ambient space by convection, and thus condenses and flows downward, as shown by the downward arrows in FIG. 5. Due to the presence of the extension chambers 561 to receive the heat transfer fluid 9, the fluid 9 is in contact with not only the tubular body 11, but also the hollow extension parts 56. This provides an increased heat transfer or heat exchange area for the fluid 9. As such, quick and effective absorption of heat by the fluid 9 can be achieved.

Figure 6:
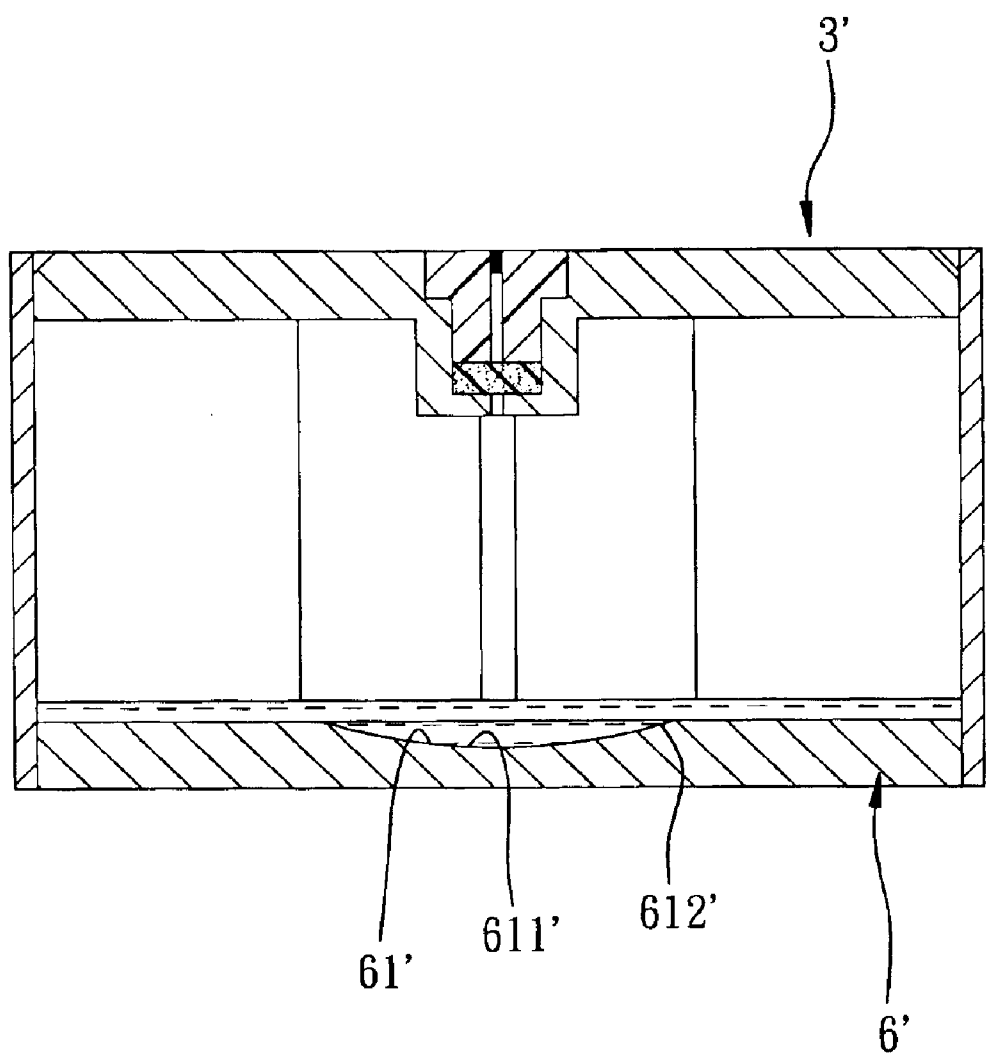
FIG. 6 is a sectional view of the second preferred embodiment of a heat dissipating device according to the present invention.

Referring to FIG. 6, the second preferred embodiment of a heat dissipating device 3' according to the present invention is shown to be substantially similar to the first preferred embodiment. However, in this embodiment, the top face 61' of the cap portion 60' of the bottom cover member 6' is indented downwardly to define a fluid accumulating portion. The top face 61' has a central part 611' and a peripheral end 612' surrounding the central part 611', and is indented from the peripheral end 612' to the central part 611' so that the bottom cover member 6 decreases in thickness from the peripheral end 612' to the central part 611'.

Figure 7:
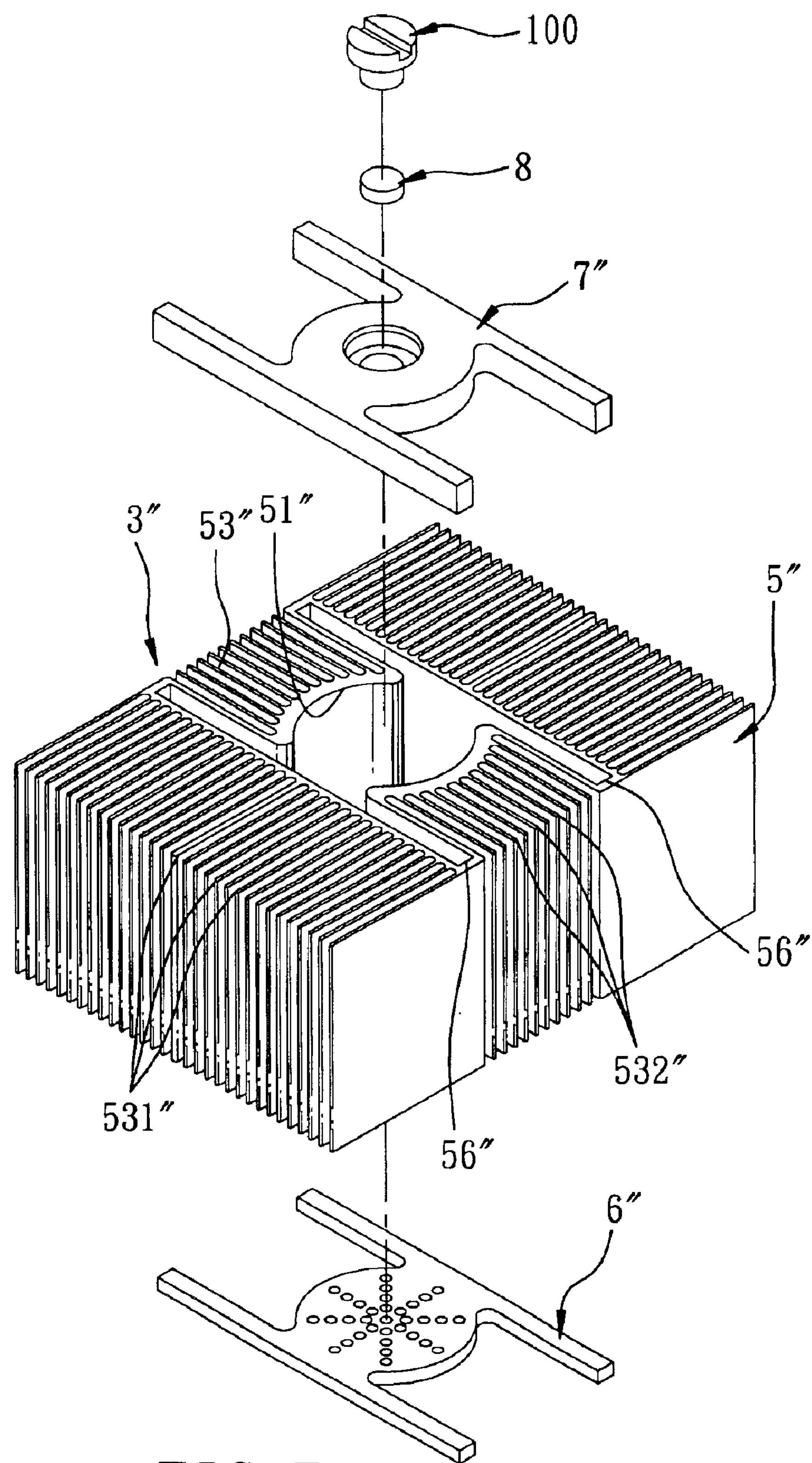
FIG. 7 is an exploded perspective view of the third preferred embodiment of a heat dissipating device according to the present invention.
Figure 8:
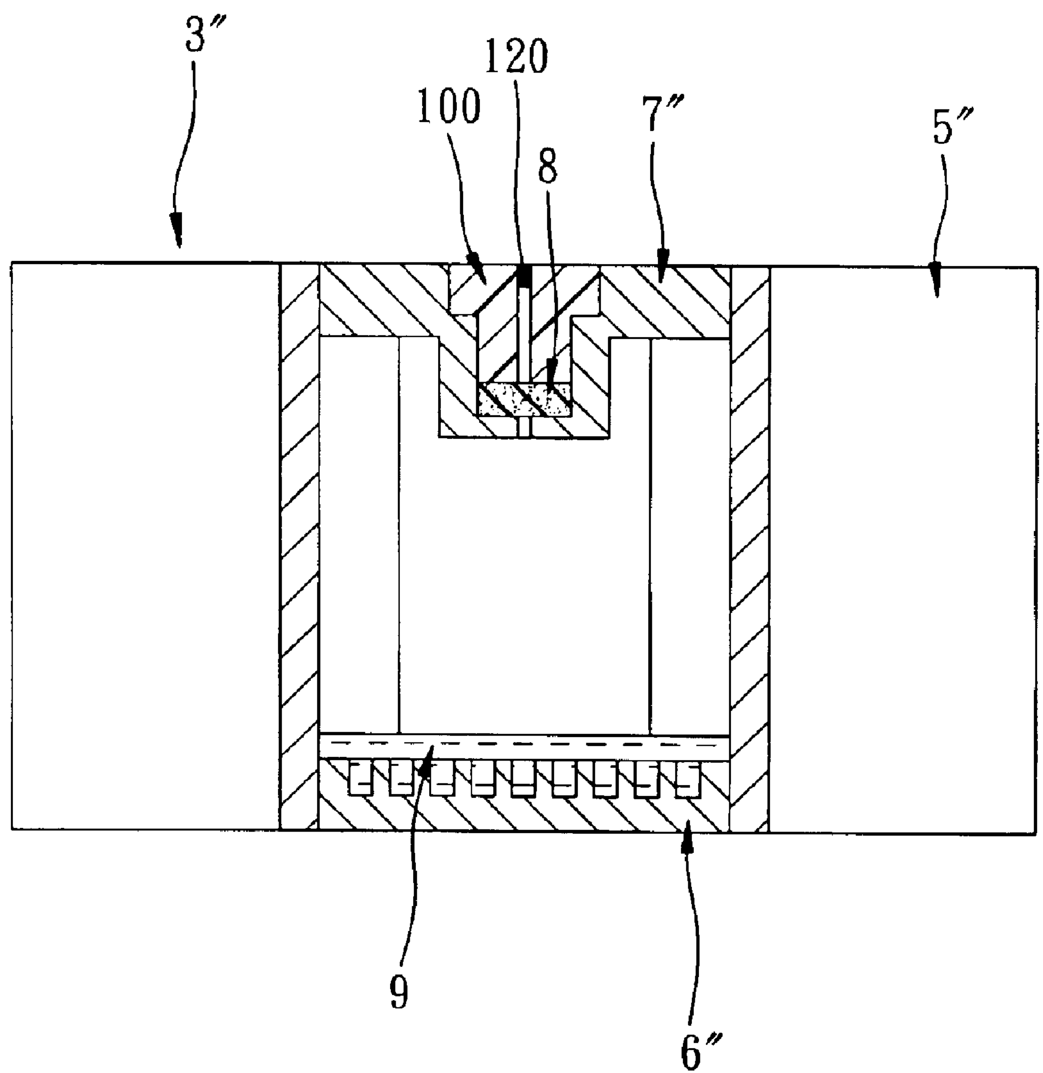
FIG. 8 is a sectional view to illustrate the tubular body of the heat dissipating device of the third preferred embodiment when sealed.

Referring to FIGS. 7 and 8, the third preferred embodiment of a heat dissipating device 3" according to the present invention is shown to be substantially similar to the first preferred embodiment. However, in this embodiment, a pair of the hollow extension parts 56" of the tubular body 5" extend tangentially and outwardly from the peripheral wall 51". A plurality of first fins 531" extend perpendicularly and outwardly from each of the extension parts 56", and a plurality of second fins 532" extend outwardly from the peripheral wall 51" and extend along lines perpendicular to the direction of the first fins 531".

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A heat dissipating device comprising:

a tubular body adapted to be mounted on a heat source, said tubular body having opposite top and bottom ends, a peripheral wall between said top and bottom ends, a main chamber defined by said top and bottom ends and said peripheral wall, at least one hollow extension part extending outwardly from said peripheral wall, and a plurality of fins extending outwardly from said peripheral wall and said extension part, said hollow extension part having an extension chamber that is in fluid communication with said main chamber, said extension part being elongated in a radial direction and narrow in a direction transverse to said radial direction;

a heat transfer fluid contained in said main chamber and said extension chamber; and a top cover member covering said top end of said tubular body, and a bottom cover member covering said bottom end of said tubular body, each of said top and bottom cover members having a cap portion covering said main chamber, and a wing portion extending outwardly from said cap portion and closing said extension chamber.

2. The heat dissipating device as claimed in claim 1, wherein said cap portion of said top cover member has a filling hole in fluid communication with said main chamber.

3. The heat dissipating device as claimed in claim 2, further comprising an elastic sealing member fitted within said filling hole, said elastic sealing member being pierceable to provide a passage for injection of said heat transfer fluid through said elastic sealing member, and being contractible to seal said passage.

4. The heat dissipating device as claimed in claim 1, wherein said cap portion of said bottom cover member has a top face formed with a plurality of spaced-apart downward slots in fluid communication with said main chamber.

5. The heat dissipating device as claimed in claim 1, wherein said cap portion of said bottom cover member has a top face indented downwardly to define a fluid accumulating portion.

* * * * *